(12) United States Patent
Kobayashi

(10) Patent No.: US 10,943,949 B2
(45) Date of Patent: Mar. 9, 2021

(54) SEMICONDUCTOR STORAGE DEVICE

(71) Applicant: Toshiba Memory Corporation, Tokyo (JP)

(72) Inventor: Yosuke Kobayashi, Shinagawa Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/291,858

(22) Filed: Mar. 4, 2019

(65) Prior Publication Data
US 2020/0161369 A1 May 21, 2020

(30) Foreign Application Priority Data
Nov. 21, 2018 (JP) .............................. JP2018-218538

(51) Int. Cl.
*H01L 43/02* (2006.01)
*H01L 27/22* (2006.01)
*H01L 43/12* (2006.01)
*G11C 11/16* (2006.01)

(52) U.S. Cl.
CPC .......... *H01L 27/228* (2013.01); *G11C 11/161* (2013.01); *H01L 43/02* (2013.01); *H01L 43/12* (2013.01)

(58) Field of Classification Search
CPC ...... H01L 27/228; H01L 43/02; G11C 11/161
See application file for complete search history.

(56) References Cited

U.S. PATENT DOCUMENTS

| 8,347,175 | B2 | 1/2013 | Ikegawa et al. | |
|---|---|---|---|---|
| 2005/0169057 | A1* | 8/2005 | Shibata | G11C 16/10 365/185.28 |
| 2008/0155363 | A1* | 6/2008 | Kohara | G11C 29/14 714/719 |
| 2009/0244992 | A1* | 10/2009 | Goetz | G11C 7/1006 365/189.15 |
| 2013/0141990 | A1* | 6/2013 | Okubo | G11C 7/1057 365/189.05 |
| 2015/0127883 | A1* | 5/2015 | Chen | G06F 3/0611 711/103 |
| 2016/0064979 | A1* | 3/2016 | Huang | H02J 7/0071 320/114 |
| 2016/0112068 | A1 | 4/2016 | Kim | |
| 2016/0114576 | A1* | 4/2016 | Tobita | B41J 2/2146 347/14 |
| 2017/0109395 | A1* | 4/2017 | Farah | G06Q 10/0639 |
| 2017/0170982 | A1* | 6/2017 | Rahman | H04L 12/2885 |
| 2018/0067697 | A1 | 3/2018 | Lee et al. | |

(Continued)

FOREIGN PATENT DOCUMENTS

JP 2012022726 A 2/2012

*Primary Examiner* — Nathan W Ha
(74) *Attorney, Agent, or Firm* — Kim & Stewart LLP

(57) ABSTRACT

A semiconductor storage device includes a plurality of memory cells and a first circuit. The first circuit is configured to read data from a subset of the memory cells, such as a page unit or the like, then determine whether the data as read from the subset contains an error. The first circuit calculates a bit error rate for the subset if the subset contains an error and performs a recovery processing on the subset if the calculated bit error rate is less than a first threshold value but greater than a second threshold value.

19 Claims, 4 Drawing Sheets

(56) References Cited

U.S. PATENT DOCUMENTS

2018/0111619 A1\*  4/2018  Hall ................... B60W 10/184
2018/0182465 A1\*  6/2018  Alhussien .......... G11C 16/3431
2018/0262505 A1\*  9/2018  Ligatti ................ G06F 21/6281
2018/0293022 A1\* 10/2018  Park ................... G06F 12/0871

\* cited by examiner

US 10,943,949 B2

SEMICONDUCTOR STORAGE DEVICE

CROSS-REFERENCE TO RELATED APPLICATION

This application is based upon and claims the benefit of priority from Japanese Patent Application No. 2018-218538, filed Nov. 21, 2018, the entire contents of which are incorporated herein by reference.

FIELD

Embodiments described herein relate generally to semiconductor storage devices.

BACKGROUND

A magnetoresistive random access memory (MRAM) is a memory device using a magnetic element having a magnetoresistive effect in a memory cell that stores information. MRAM is being developed as a next-generation memory device for high-speed operations, large capacity, and non-volatile data retention. In addition, MRAM is being developed as replacement for volatile memories, such as DRAM or SRAM. For such uses, it is desirable to operate the MRAM according to the same specifications as used for a DRAM or a SRAM to reduce development cost and to permit simple replacement of such technologies with MRAM.

DETAILED DESCRIPTION

Figure 1:
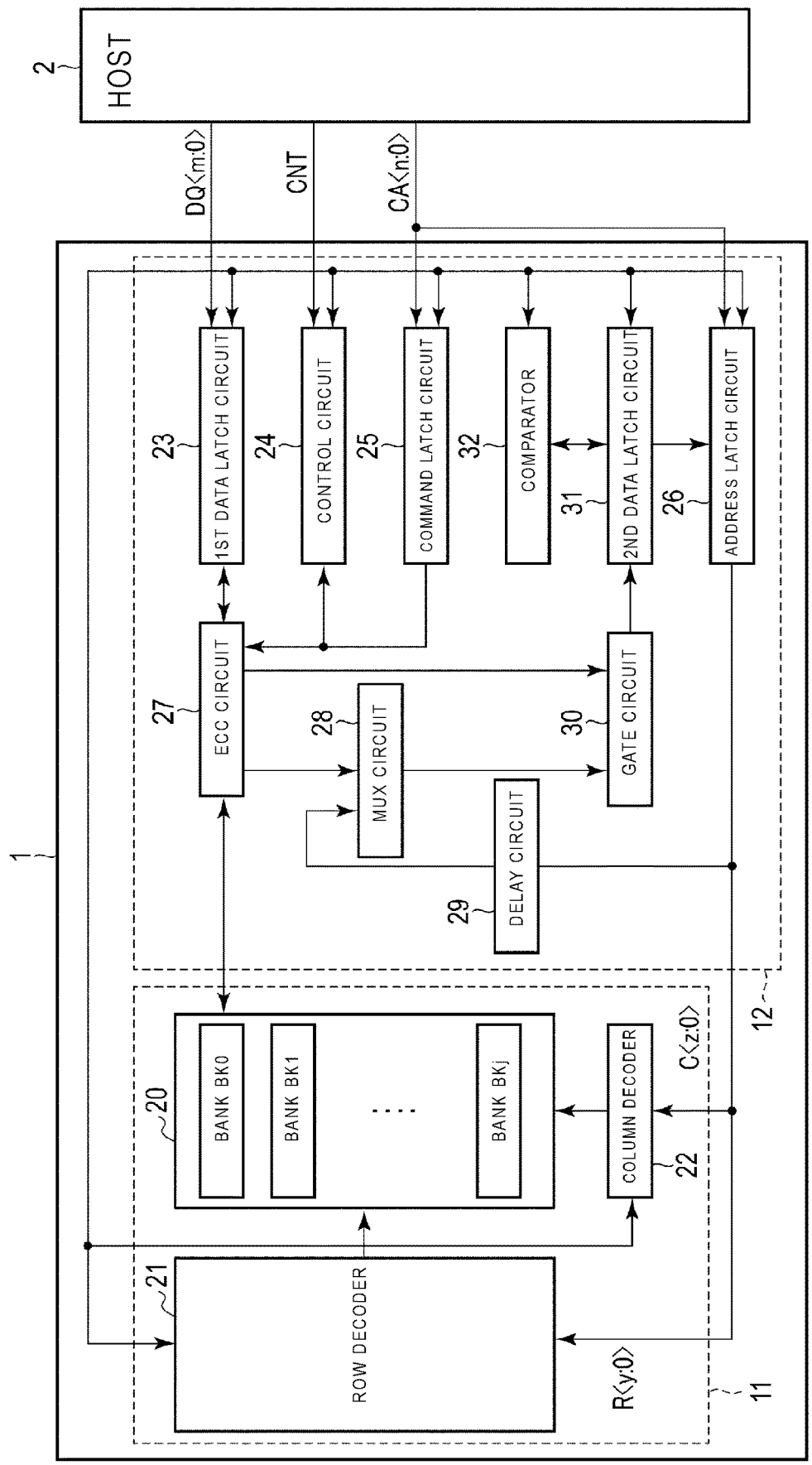
FIG. 1 is a diagram showing a memory system according to an embodiment.

In general, according to one embodiment, a semiconductor storage device includes a plurality of memory cells and a first circuit. The first circuit is configured to read data from a subset of the memory cells, then determine whether the data as read from the subset contains an error. The first circuit calculates a bit error rate for the subset if the subset contains an error and performs a recovery processing on the subset if the calculated bit error rate is less than a first threshold value but greater than a second threshold value.

Hereinafter, example embodiments will be described with reference to the drawings. In the following description, the same reference numeral is given to the same aspect or element depicted in different drawings.

<1-1> Memory System

First, a memory system according to an embodiment will be described. As shown in FIG. 1, the memory system includes a semiconductor storage device 1 and a host 2. The host 2 may be an external device to which the semiconductor storage device is connected or alternatively may be a memory controller to which the semiconductor storage device is attached. The semiconductor storage device 1 of the embodiment is, for example, a spin transfer torque magnetoresistive random access memory (STT-MRAM).

As shown in FIG. 1, the semiconductor storage device 1 includes a memory core 11 and a peripheral circuit 12.

The memory core 11 includes a plurality of memory cells for storing data.

The peripheral circuit 12 writes data to and reads data from the memory core 11. The peripheral circuit 12 includes a pad unit for receiving a command, an address, data, and the like. The pad unit includes a plurality of pads. The peripheral circuit 12 is connected to the host 2 via the pad unit and a control signal line CNT. In addition, the peripheral circuit 12 is connected to the host 2 via the pad unit and a command/address line CA<n: 0>. In addition, the peripheral circuit 12 is connected to the host 2 via the pad unit and a data line DQ<m: 0>. Here, n and m are natural numbers.

The control signal line CNT is used to transmit and receive a control signal. Control signals in this context includes: a clock signal CK/CKb, a clock enable signal CKE, and a chip select signal CS. The command/address line CA<n: 0> is used to transmit and receive a command and an address. The data line DQ<m: 0> is used to transmit and receive data between the semiconductor storage device 1 and a host 2.

The control signal line CNT, the command/address line CA <n: 0> and the data line DQ<m: 0> may be wirings including pins connected to corresponding pads of the pad unit, or may be pins themselves.

<1-2> Semiconductor Storage Device

The semiconductor storage device 1 will be described with reference to FIG. 1.

<1-2-1> Memory Core

The memory core 11 includes a memory region 20, a row decoder 21, and a column decoder 22. The memory region 20 includes (j+1) banks (banks BK0 to BKj), in which j is a natural number. For example, the banks BK0 to BKj may be independently activated. In description where the banks BK0 to BKj are not distinguished from each other, the banks BK0 to BKj are simply referred to as banks BK.

The row decoder 21, for example, decodes a bank address BA <x: 0> used for selecting one of the banks BK0 to BKj, and a row address R<y: 0> for selecting a row in the selected bank.

For example, the column decoder 22 decodes a column address C<z: 0> for selecting a column in the memory region 20.

<1-2-2> Peripheral Circuit

As shown in FIG. 1, the peripheral circuit 12 includes: a first data latch circuit 23, a control circuit 24, a command latch circuit 25, an address latch circuit 26, an error correcting code (ECC) circuit 27, a multiplexer (MUX) 28, a delay circuit 29, a gate circuit 30, a second data latch circuit 31, and a comparator 32.

The first data latch circuit 23 temporarily stores input data received from the host 2 via the data line DQ<m: 0> or output data read from a selected bank. The input data subsequently is written into memory cells of the selected bank.

The control circuit 24 controls an operation of the semiconductor storage device 1 based on the clock enable signal CKE, the chip select signal CS, and a command CMD from the host 2.

The command latch circuit 25 receives the command CMD from the host 2 via the command/address line CA<n: 0>, and temporarily stores the command CMD. The command CMD is transmitted to the control circuit 24 and the ECC circuit 27.

The address latch circuit 26 receives an address ADD. The address latch circuit 26 transmits a bank address and a row address R<y: 0> in the address ADD to the row decoder 21 and transmits a column address C<z: 0> to the column decoder 22.

When data is written, the ECC circuit 27 generates a parity bit (or other error correction code information) for the data to be written into the first data latch circuit 23 and adds the parity bit to the data to be written. The data to which the parity bit has been added is written into a memory cell array.

In addition, the ECC circuit 27 also performs error correction processing on the data output from the memory cell array to the first data latch circuit 23 during a data reading operation. The ECC circuit 27 checks whether there is an error in the data read from the memory cell array through error correction processing using the parity bit (or other error correction code information) When an error in the data is detected, the ECC circuit 27 operates to correct the detected error. The ECC circuit 27 may be provided in the memory region 20 (bank BK) in some examples.

In addition, when the ECC circuit 27 determines the presence of an error, the ECC circuit 27 outputs an "H (High)" level error detection signal DET. In addition, when the ECC circuit 27 determines that there is no error, the ECC circuit 27 outputs an "L (Low)" level error detection signal DET.

The delay circuit 29 delays an address used in data reading to adjust timing as appropriate.

The MUX circuit 28 merges the data from the ECC circuit 27 and the address obtained via the delay circuit 29. This address corresponds to the address of the data reading.

When receiving the "H" level error detection signal DET from the ECC circuit, the gate circuit 30 transfers the data and the address merged in the MUX circuit 28 to the second data latch circuit 31.

The second data latch circuit 31 stores the address and the data of fail bits. In addition, the second data latch circuit 31 stores the number of times of recovery processing N and an error rate P as a count value. Here, the recovery processing refers to an operation of writing a random value to a memory cell. Here, the error rate P is a bit error rate (BER) value and the error rate P refers to an occurrence rate for errors per memory cell.

The comparator 32 stores the number of times of recovery processing N or a threshold value relating to the error rate P and compares the number of times of recovery processing N or the threshold value relating to the error rate P with the number of times of recovery processing or the error rate stored in the second data latch circuit 31.

<1-2-3> Bank BK

Figure 2:
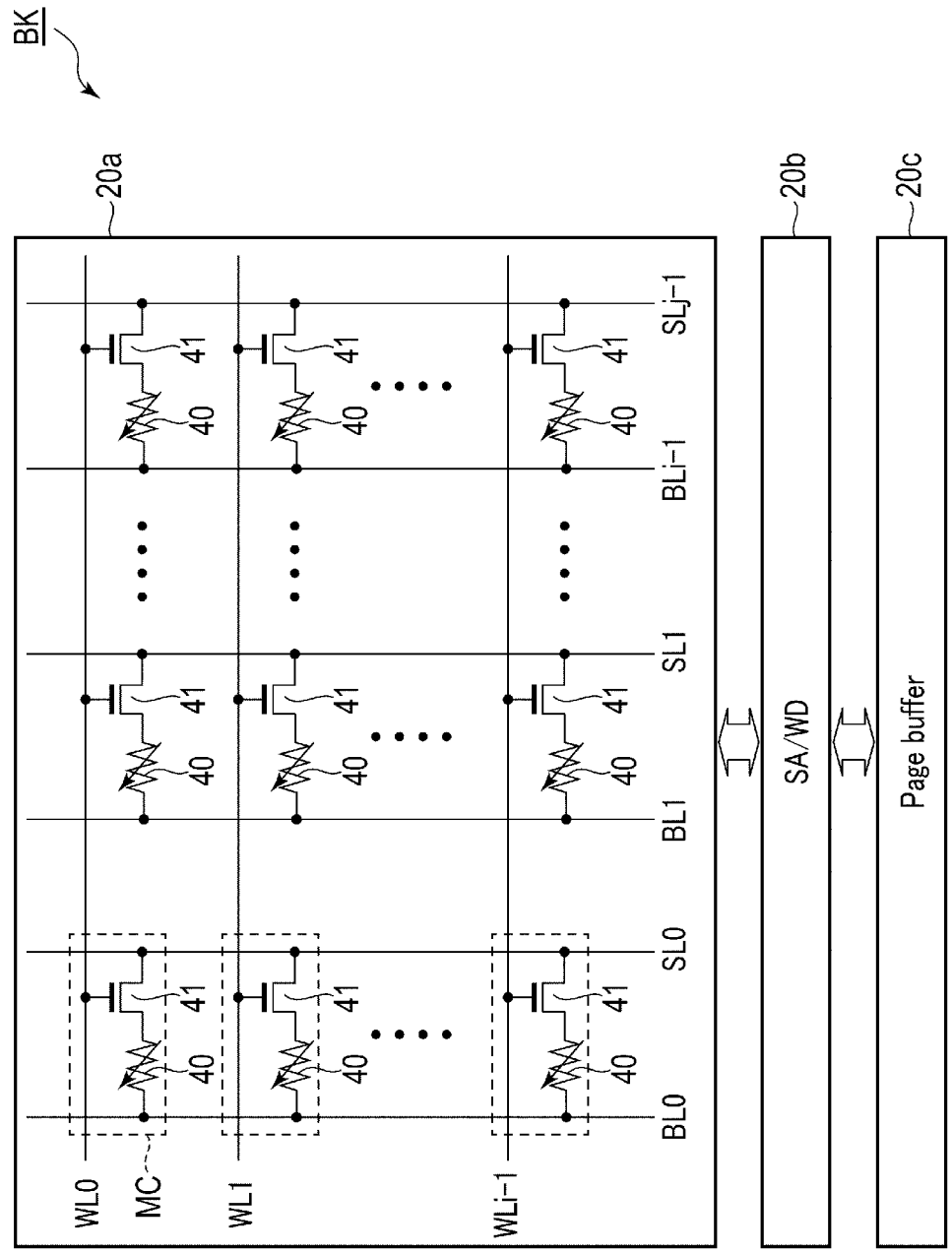
FIG. 2 is a diagram showing a bank of the memory system according to an embodiment.

Next, the banks BK of the memory region 20 will be described with reference to FIG. 2. Each bank BK includes: a sense amplifier/write driver (SA/WD) 20b, a page buffer 20c, and a memory cell array 20a.

The sense amplifier/write driver 20b is disposed in a bit line direction of the memory cell array 20a. The sense amplifier/write driver 20b includes a sense amplifier and a write driver. The sense amplifier is connected to a bit line BL (one of bit lines BL0 to BLi−1) and detects a current flowing through a memory cell MC connected to a selected word line WL (one of word lines WL0 to WLi−1), so as to read data stored in the memory cell MC. The write driver is connected to the bit line BL and supplies a current through the memory cell MC connected to the select word line WL, so as to write data. The sense amplifier/write driver 20b controls the bit lines BL and a source line SL (one of source lines SL0 to SLj−1) based on a control signal from the control circuit 24.

Data exchange between the sense amplifier/write driver 20b and the data line DQ is performed via the first data latch circuit 23.

The page buffer 20c temporarily stores data read from the memory cell array 20a or data to be written that has been received from the host 2. Writing of data to the memory cell array 20a is performed in a plurality of memory cell transistors equal to a page unit. In this way, the unit which is collectively written into the memory cell array 20a is referred to as a "page". The page buffer 20c according to the embodiment is provided for each bank BK and has a storage capacity sufficient to temporarily store data of all the pages of the bank BK.

When data is written to the memory cell array 20a, the host 2 transmits a write command, a page address indicating a writing destination, and data to be written to the semiconductor storage device 1. The control circuit 24 stores the data received from the host 2 in the page buffer 20c and then writes the received data in the page buffer 20c to the memory cell MC designated by the page address.

When data is read from the memory cell array 20a, the host 2 transmits a read command and a page address indicating a read destination to the semiconductor storage device 1. The control circuit 24 reads data from the memory cells MC designated by the page address into the page buffer 20c.

The memory cell array 20a comprises a plurality of memory cells MC in a matrix array. A plurality of word lines WL0 to WLi−1, a plurality of bit lines BL0 to BLj−1, and a plurality of source lines SL0 to SLj−1 are disposed in the memory cell array 20a. Each row of the memory cell array 20a is connected to one word line WL, and Each column of the memory cell array 20a is connected to a pair of lines including one bit line BL and one source line SL.

Each memory cell MC includes a magnetoresistive effect element 40 and a select transistor 41. The select transistor 41 includes, for example, an N-channel MOSFET. The magnetoresistive effect element 40 may also be referred to as a magnetic tunnel junction (MTJ) element 40 in some contexts.

One end of the magnetoresistive effect element 40 is connected to a bit line BL, and the other end is connected to a drain (or source) of the select transistor 41. A gate of the select transistor 41 is connected to a word line WL, and the source (or drain) is connected to the source line SL.

The above-described configuration of the banks BK is one example, and the banks BK may have other configurations.

<1-3> Bit Failure

Figure 3:
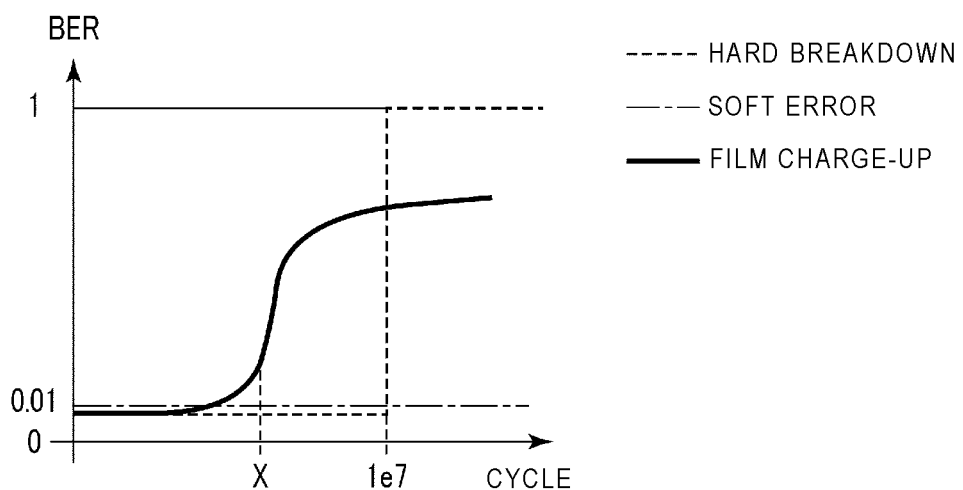
FIG. 3 is a diagram depicting a relationship between a writing operation cycles and a bit error rate.

From a viewpoint of endurance (rewriting life), bit failures of an MRAM cell is mainly divided into three types: "hard breakdown", "soft error", and "film charge-up", as shown in FIG. 3. A relationship between the number of writing operations (cycles) performed on the memory cell MC and a bit error rate (BER) is shown in FIG. 3.

The "hard breakdown" refers to an irreversible bit failure occurring after a certain cycle number (for example, $1 \times 10^7$ cycles) is exceeded and a storage film in the memory cell is damaged, such that an error rate becomes equal to 1 and does not recover.

The "soft error" refers to a bit failure in which an error rate is substantially constant (for example, 0.01) with respect to the cycle number.

Figure 4:
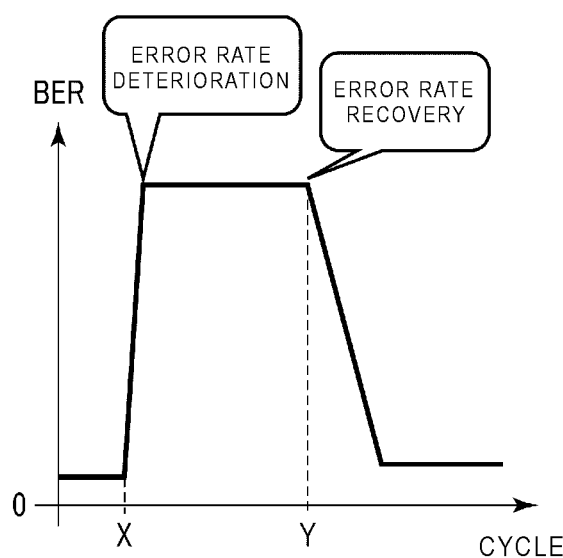
FIG. 4 is a diagram depicting a relationship between writing operation cycles related to film charge-up and a bit error rate.

As shown in FIG. 4, the "film charge-up" refers to a reversible bit failure in which the error rate recovers (decreases) through applying additional stress (Y times of cycles) to the memory cell or leaving the memory cell unused when the error rate is high. The error rate of "film charge-up" is, for example, higher than 0.01 and lower than 1.

The film charge-up errors tends to occur at a stage earlier (for example, $X<1\times10^7$ times) than the hard breakdown. Therefore, useful lifetime of the chip is potentially limited by the film charge-up phenomenon.

In the present embodiment, processing for positively promoting recovery is performed on memory cells in which a film charge-up failure has occurred.

<1-4> Operation

Figure 5:
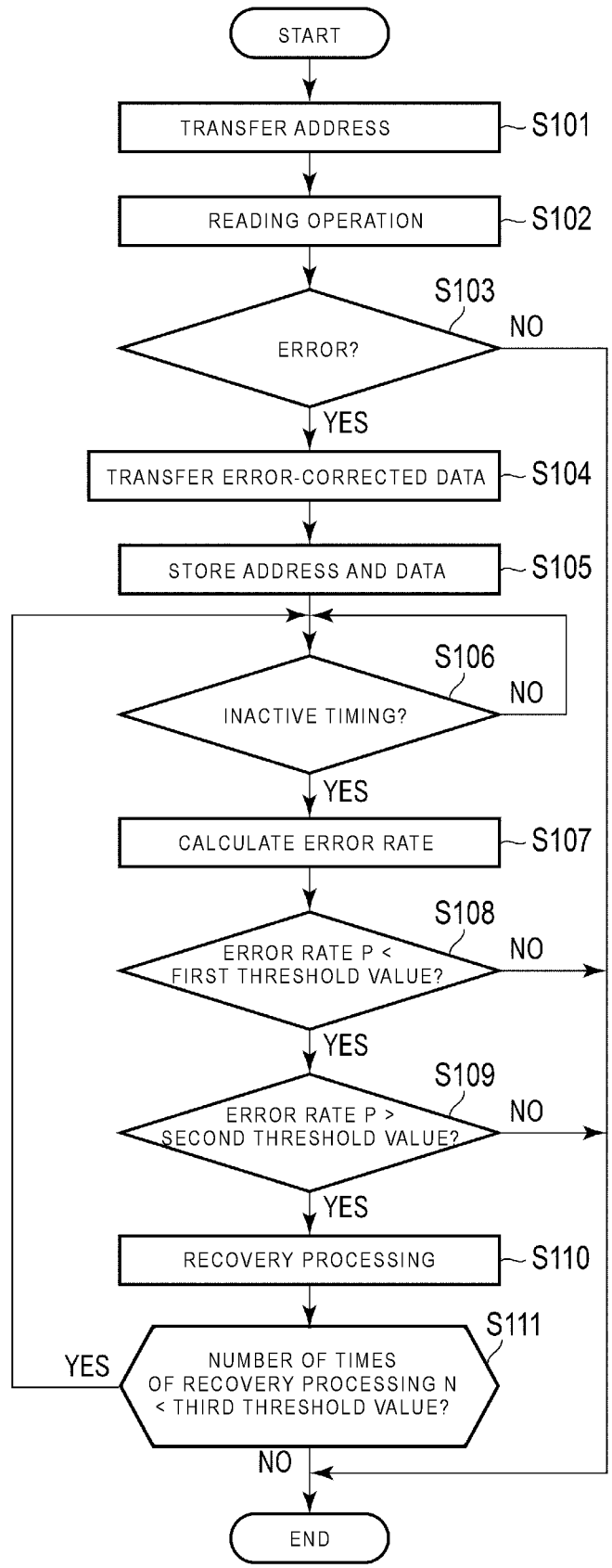
FIG. 5 is a flowchart of recovery processing for a memory system according to an embodiment.

Next, recovery processing of the memory system according to the present embodiment will be described with reference to FIG. 5.

[S101]

When a reading request comes from the host 2 to the semiconductor storage device 1, an address to be read is stored in the address latch circuit 26. For example, the reading is to be performed in a page unit. The address stored in the address latch circuit 26 is transferred to the row decoder 21, the column decoder 22, and the delay circuit 29.

[S102]

The control circuit 24 reads data from the memory region 20 based on the address stored in the address latch circuit 26.

[S103]

The data read from the memory region 20 (referred to as the "read data") is transferred to the ECC circuit 27. The ECC circuit 27 determines presence or absence of an error in the read data.

When the ECC circuit 27 determines that there is no error in the read data (S103, NO), the ECC circuit 27 outputs an "L" level error detection signal DET and the read data. When receiving the "L" level error detection signal DET, the gate circuit 30 does not transfer the data from the MUX circuit 28 to the second data latch circuit 31. In addition, the read data is stored in the first data latch circuit 23.

[S104]

When the ECC circuit 27 determines that there is an error in the read data (S103, YES), the ECC circuit 27 outputs an "H" level error detection signal DET and corrects the error of the read data. Upon correcting the error of the read data, the ECC circuit 27 transfers the corrected read data to the first data latch circuit 23 and the MUX circuit 28.

[S105]

The MUX circuit 28 merges the corrected read data and the address used for reading out the read data supplied via the delay circuit 29. Then, the MUX circuit 28 supplies the corrected read data and the address to the gate circuit 30.

When receiving the "H" level error detection signal DET, the gate circuit 30 supplies the corrected read data and the address to the second data latch circuit 31.

Accordingly, the corrected read data and the address associated with each other are stored in the second data latch circuit 31.

[S106]

The control circuit 24 determines whether or not the semiconductor storage device 1 is at an inactive timing with no read or write command being supplied to the memory region 20.

[S107]

When the control circuit 24 determines that the semiconductor storage device 1 is at the inactive timing (S106, YES), the control circuit 24 performs writing and reading operations for a plurality of times (for example, 100 times) to the address stored in the second data latch circuit 31.

Specifically, writing is performed to an address that was detected as having an error, reading is performed to this written address, and then presence or absence of the error is determined in the ECC circuit 27. The control circuit 24 calculates the error rate P for the written address by repeating this operation for a plurality of times. After calculating the error rate P, the control circuit 24 stores the error rate P in the second data latch circuit 31.

[S108]

The comparator 32 determines whether or not the error rate P stored in the second data latch circuit 31 is less than a first threshold value stored in the comparator 32. Specifically, the comparator 32 determines whether or not the error rate P is less than 1. In this example, when the comparator 32 determines that the error rate P is equal to 1 (S108, NO), the comparator 32 determines that a "hard breakdown" has occurred in the corresponding memory cell for the writing address, and ends this operation. As described above, when a "hard breakdown" occurs, the memory cell will not be recovered or restored to useful operation.

[S109]

When the comparator 32 determines that the error rate P is less than 1 (S108, YES), the comparator 32 determines whether or not the error rate P stored in the second data latch circuit 31 is larger than a second threshold value stored in the comparator 32. Specifically, the comparator 32 in this example determines whether or not the error rate P is more than 0.01. When the comparator 32 determines that the error rate P is 0.01 or less (S109, NO), the comparator 32 determines that the corresponding memory cell has been recovered and ends this operation.

[S110]

When the error rate P is determined to be more than 0.01 (S109, YES), but less than 1, the control circuit 24 transfers an address for recovery processing from the second data latch circuit 31 to the address latch circuit 26. Based on this address, random write processing or recovery processing is performed on the memory cell having an error. This recovery processing is, for example, 1000 to 1 million writing processes with random data. The number of times may be appropriately changed based on known characteristics of the memory cells MC. In addition, the object of the recovery processing is a read address, that is, the plurality of memory cells (e.g., the page unit) including the memory cell in which the error occurred.

After the recovery processing, the control circuit 24 stores the number of times of the recovery processing N in the second data latch circuit 31.

[S111]

After the recovery processing, the comparator 32 determines whether or not the number of times of the recovery processing N is less than a third threshold value stored in the comparator 32. When the number of times of the recovery processing N exceeds the third threshold value (S110, NO), the comparator 32 ends the operation. When the number of times of the recovery processing N is equal to or less than the third threshold value (S110, YES), the comparator 32 repeats S106.

<1-5> Effect

According to the embodiment described above, a storage region (e.g., the second data latch circuit) is provided for accumulating fail information (e.g., an error address and error data), and the writing processing is actively performed on a failed bit address when the memory is inactive, so that a failure can be recovered. In general, a recoverable film charge-up error is characterized by an error rate that is higher than the soft error rate, but lower than the hard breakdown rate. Therefore, when a failed memory cell is detected by ECC or the like at the time of reading, then writing and reading operations are repeated as a charge-up error recovery operation. For example, the detected failure is considered to be a film charge-up induced error when the measured error rate P is 0.01<P<1, and the recovery processing is repeatedly performed on the failed bit address (e.g., 100 to 1,000,000 additional writing cycles) until the P is reduced to P<0.01. The recovery processing ends if it is determined that the failed bit is recovered (P<0.01), the bit is completely broken during the recovery processing (P=1), or the total number of times of the recovery processing N exceeds some upper limit (N>$10^7$ cycles).

<2> Modification and the Like

In the above-described embodiment, a target of the recovery processing is a read unit, that is, the page unit of memory cells including the particular memory cell having the detected error are all processed in the recovery processing. In other words, the recovery processing is performed also on memory cells in which no error has occurred. However, in other examples, the recovery processing may be performed only on the specific memory cell in which the error occurred.

Specifically, when an error is detected, the ECC circuit 27 can be configured to generate a bit mask signal which permits writing to be performed only on the memory cell (or cells) in which an error was detected from among the memory cells of an error correction unit (e.g. a page unit). The bit mask signal prevents a writing operation from being performed on a target memory cell. "No writing on a memory cell" is expressed as "masking" or the like in this description.

After error correction, the ECC circuit 27 supplies the bit mask signal to the MUX circuit 28 together with corrected data.

As in the above-described embodiment, the MUX circuit 28 merges the corrected data with an address related to the corrected data, and further merges the bit mask signal. Then, the MUX circuit 28 supplies the corrected read data, the address, and the bit mask signal to the gate circuit 30.

The gate circuit 30 supplies the corrected read data, the address, and the bit mask signal to the second data latch circuit 31 when receiving the "H" level error detection signal DET.

Accordingly, the corrected read data, the address, and the bit mask signal which are associated with each other are stored in the second data latch circuit 31.

When using the bit mask signal during the recovery processing, the control circuit 24 can prohibit the recovery processing on those memory cells in which no error has been detected.

Therefore, excessive writing stress on those memory cells in which no error was detected can be prevented.

The configuration of the bank Bk described in the above embodiment is only an example, and various modifications are possible.

The same advantages as the above-example embodiment (s) can be achieved even when the switching element is a two-terminal type switching element capable of selecting a memory cell between two different lines, for example, a bit line and a source line, rather than a three-terminal type switching element as described above.

An industrial or technological standard applicable to the semiconductor storage device of an embodiment may be a JEDEC memory standard such as LPDDR and DDR. In other embodiments, the memory may not be based on a specific industrial or technological standard.

The above disclosure describes, as one example of the semiconductor storage device, an MRAM device including a magnetoresistive effect element. The semiconductor storage devices according to the present disclosure are not limited thereto and may be any of various types of semiconductor storage devices including volatile memories and nonvolatile memories. The semiconductor storage device may also be a resistance change memory device similar to a MRAM device, such as a resistive random access memory (ReRAM) or a phase-change random access memory (PCRAM).

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
a plurality of memory cells; and
a first circuit configured to:
  read data from a subset of the memory cells,
  determine whether the data as read from the subset contains an error,
  calculate a bit error rate for the subset if the subset contains an error, and
  perform a recovery processing on the subset if the calculated bit error rate is less than a first threshold value, wherein
the first circuit is configured to not perform the recovery processing on the subset when the calculated bit error rate is less than or equal to the second threshold value but greater than a second threshold value.

2. The semiconductor storage device according to claim 1, wherein the first circuit calculates the bit error rate by repeatedly writing data to the subset and reading the data from the subset.

3. The semiconductor storage device according to claim 1, wherein the first circuit is further configured to not perform the recovery processing on the subset when the calculated bit error rate is greater than the first threshold value.

4. The semiconductor storage device according to claim 1, wherein the first circuit comprises a comparator storing the first threshold value and the second threshold value.

5. The semiconductor storage device according to claim 1, wherein the first circuit comprises an error correction coding circuit configured to determine whether the data as read from the subset contains an error.

6. The semiconductor storage device according to claim 5, wherein the error correction coding circuit is configured to generate a bit mask signal by which only particular memory cells having detected errors in the subset are subjected to recovery processing.

7. The semiconductor storage device according to claim 1, wherein only particular memory cells having detected errors in the subset are subjected to recovery processing.

8. The semiconductor storage device according to claim 1, wherein the recovery processing comprises repeatedly writing random data to the subset.

9. The semiconductor storage device according to claim 8, wherein the number of repeated writings of random data to the subset in the recovering processing is limited to a predetermined limit.

10. The semiconductor storage device according to claim 1, wherein the subset is a page unit of the plurality of memory cells.

11. The semiconductor storage device according to claim 1, wherein the plurality of memory cells are magnetoresistive random access memory cells.

12. The semiconductor storage device according to claim 1, wherein the first circuit is configured to perform the recovery processing during an idle state of the semiconductor storage device.

13. A semiconductor memory device, comprising:
a plurality of memory cells;
a peripheral circuit including an error correction coding circuit and a comparator and configured to:
read data from a subset of the memory cells,
detect whether the data as read from the subset contains an error by an output of the error correction coding circuit,
calculate a bit error rate for the subset when the subset contains an error by repeatedly writing and reading data to and from the subset and detecting a total number fail bits in the subset after each writing,
determine a hard breakdown failure has occurred when the comparator indicates the calculated bit error rate is greater than or equal to a first threshold value stored in the comparator, and
perform a recovery processing on the subset when the comparator indicates the calculated bit error rate is less than the first threshold value but greater than a second threshold value stored in the comparator, the recovery processing comprising repeatedly writing random data to the subset up to a predetermined limit of repeated writings.

14. The semiconductor memory device according to claim 13, wherein the peripheral circuit is configured to calculate the bit error rate and perform the recovery processing during an idle state of the semiconductor memory device.

15. The semiconductor memory device according to claim 13, wherein the error correction coding circuit is configured to generate a bit mask signal by which only particular memory cells having detected errors in the subset are subjected to recovery processing.

16. The semiconductor memory device according to claim 13, wherein the subset is a page unit of the plurality of memory cells.

17. A method of operating a semiconductor storage device having a plurality of memory cells, the method comprising:
reading data from a subset of the plurality of memory cells;
detecting whether the data as read from the subset contains an error by an output of an error correction coding circuit;
calculating a bit error rate for the subset when the subset contains an error by repeatedly writing and reading data to and from the subset and detecting a total number fail bits in the subset after each writing;
determining a hard breakdown failure has occurred when the calculated bit error rate is greater than or equal to a first threshold value; and
performing a recovery processing on the subset when the calculated bit error rate is less than the first threshold value but greater than a second threshold value, the recovery processing comprising repeatedly writing random data to the subset up to a predetermined limit of repeated writings.

18. The method according to claim 17, wherein the calculating of the bit error rate and the performing the recovery processing are controlled to occur during an idle state of the semiconductor storage device.

19. The method according to claim 17, further comprising:
generating a bit mask signal by which only particular memory cells having detected errors in the subset are subjected to recovery processing.

* * * * *